United States Patent [19]
Lee

[11] Patent Number: 5,940,336
[45] Date of Patent: Aug. 17, 1999

[54] REFERENCE CLOCK GENERATING CIRCUIT IN MEMORY TO BE ASYNCHRONOUSLY PRECHARGED AND ACTIVATED

[75] Inventor: Sang-Hyun Lee, Anyang, Rep. of Korea

[73] Assignee: LG Semicon Co., Ltd., Chungcheongbuk-do, Rep. of Korea

[21] Appl. No.: 08/956,105

[22] Filed: Oct. 24, 1997

[30] Foreign Application Priority Data

Dec. 21, 1996 [KR] Rep. of Korea ........................ 96-69651

[51] Int. Cl.⁶ ........................................ G11C 7/00
[52] U.S. Cl. ...................... 365/203; 365/233; 365/233.5; 365/191
[58] Field of Search ................ 365/233, 233.5, 365/191, 203

[56] References Cited

U.S. PATENT DOCUMENTS

| | | | |
|---|---|---|---|
| 4,355,377 | 10/1982 | Sud et al. ................................. | 365/203 |
| 5,598,375 | 1/1997 | Yang et al. .......................... | 365/230.06 |
| 5,604,712 | 2/1997 | Priebe ................................. | 365/230.06 |
| 5,654,927 | 8/1997 | Lee ......................................... | 365/203 |

OTHER PUBLICATIONS

Sow T. et al., A 25-ns Low-Power Full CMOS 1-Mbit (128Kx8) SRAM, Sow T. Chu et al., IEEE Journal of Solid-State Circuits, vol. 23, No. 5, Oct. 1988, pp. 1078-1083.

*Primary Examiner*—David Nelms
*Assistant Examiner*—Vanthu Nguyen

[57] ABSTRACT

A reference clock generating circuit and method, the circuit having an OR unit for ORing signals, from plural address change defectors, indicative of a change in an inputted address to provide an OR-result on a common terminal; a delay unit for delaying the signals on the common terminal for a predetermined time; a pull-up unit for pulling-up an output potential on the common terminal according to an output signal of the delay unit; and a stabilizing unit for stabilizing a signal on the common terminal.

20 Claims, 7 Drawing Sheets

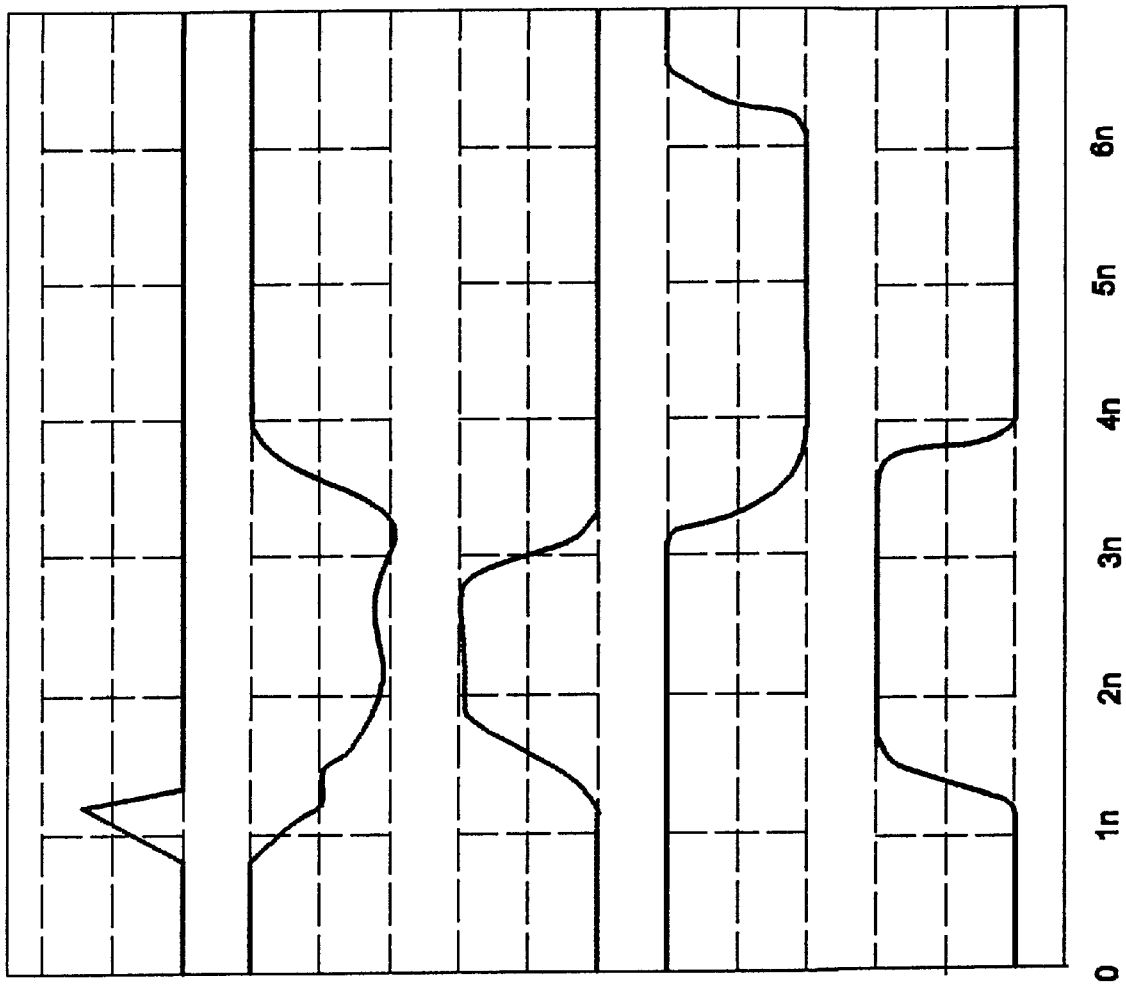

REFERENCE CLOCK GENERATING CIRCUIT IN MEMORY TO BE ASYNCHRONOUSLY PRECHARGED AND ACTIVATED

FIELD OF THE INVENTION

The present invention relates to a circuit for generating a variety of precharge signals or active signals in a memory. More particularly, the present invention relates to a control circuit for controlling pulse width in the memory which prevents its malfunction according to short pulse noise during an address input, or another noise on a power bus during an operation of the memory.

BACKGROUND OF THE INVENTION

FIG. 1 is a construction diagram illustrating a conventional circuit for generating a variety of control signals, i.e., many kinds of precharge signals or active signals, which are used for accessing data in semiconductor memory elements.

In static RAM (SRAM) technology, there is a technique known as address-transition detection (ADT). In ADT, a change in the address input is sensed so that the bit lines that will be effected can be equilibrated sooner. In the construction of FIG. 1, a coupling part 10 and a clock generating part 20, which are shown in a dotted line, generate reference clocks of the control signals for controlling operations of the memory elements according to the ADT technique.

FIG. 2 is a construction diagram illustrating a reference clock generating circuit according to the conventional art. Referring to FIG. 2, there are provided the coupling part 10 and the clock generating part 20. The clock generating part 20 develops a one-shot pulse in response to the detection of an address transition. This pulse is used to activate the bit line equilibration, and optionally the bit line pre-charge as well. The coupling part 10 includes a plurality of NMOS transistors MN1~MNn. The clock generating part 10 includes a delay circuit 21, a first PMOS transistor MP1, a second PMOS transistor MP2, and an inverter INV.

The plurality of NMOS transistors MN1~MNn in the coupling part 10 act as output transistors for the n address change detecting parts. The plurality of NMOS transistors MN1~MNn are turned on/off according to a corresponding plurality of detection signals ATDi outputted from a plurality of address change detecting parts of FIG. 1, the signals ATD, changing according to changes in address data. Further, when turned on, the plurality of NMOS transistors MN1~MNn maintain the potential of their drain terminals at the same level as that of their source terminals, i.e., they pull the line ATCOM down to VSS. The delay circuit 21 has inputted to it a potential on a common bus ATCOM and delays the potential for a predetermined time before outputting it.

The first PMOS transistor MP1, on whose gate terminal is inputted an output signal VG of the delay circuit 21, is turned on when the output signal VG is at the low level, and transmits a predetermined positive voltage VCC to the common bus ATCOM connected with its drain terminal, the positive voltage VCC being inputted to its source terminal. Then, the first PMOS transistor MP1 pulls-up the common bus ATCOM. The second PMOS transistor MP2 maintains the common bus ATCOM at the high level during a stable state. The inverter INV has inputted to it the potential on the common bus ATCOM and outputs the inverted potential to drive a load (not shown) connected to its output terminal ATDSUM.

The above constructions are designed to synchronize an internal signal by generating the short pulse according to the output signal from the change detecting part in the memory to be asynchronously driven. At this time, a change detecting part should be associated with each input buffer of the inputted address data.

In operations with reference to FIG. 2, the outputs ATD of the change detecting part drive the common bus ATCOM by the coupling part 10. The coupling part 10 uses a tree type OR-gate or a wired OR-gate structure, the latter being depicted in FIG. 2.

FIGS. 3A–3D depict wave forms for the main parts of the circuit of FIG. 2 during its normal operation. FIGS. 4A–4D depict waveforms for the main parts of the circuit of FIG. 2 during its abnormal operation. Referring to FIGS. 3 and 4, the following describes operation of the circuit for generating the control signals which are used for accessing the data of the semiconductor memory elements.

In the case that the memory is at a static state, the common bus ATCOM is raised to the high level by the always-on second PMOS transistor MP2. At this time, since the output ATDi of the change detecting part is at the low level, the NMOS transistors MN1~MNn for a pull-down operation are turned off. The output signal VG of the delay circuit 21 is the high level, so the first PMOS transistor MP1 is also turned off. Therefore, the output ATDSUM is maintained at the low level.

If a change arises in the i-th address of the address signals inputted from the outside, and an output ATDi of the i-th change detecting part is thereby changed to the high level (see FIG. 3A), the NMOS transistor MNi is turned on and the common bus ATCOM is thus changed to the low level (see FIG. 3B). At this point, the second PMOS transistor MP2 having a large resistance value is not intended to have influence on a level change of the common bus ATCOM. Thereafter, if the output ATDi of the i-th change detecting part is changed to the low level, the common bus ATCOM is maintained at the low level as a floating state.

At this moment, if the signal from the delay circuit 21 is applied to the gate terminal of the first PMOS transistor MP1, i.e., a signal VP inputted to the gate terminal of the first PMOS transistor MP1 is at the low level (see FIG. 3C), the first PMOS transistor MP1 is turned on and the common bus ATCOM is thus changed to the high level (see FIG. 3B).

Therefore, pulse width of the output signal ATDSUM of the inverter INV is the same as a delay time of the delay circuit 21 (see FIG. 3D).

Further, when the memory is operated or the memory is at the static state, the short pulse can be applied, as noise, to an address input terminal of the memory by an external system. Furthermore, in the case that a large current flows during the output change of the memory, noise may be generated in the internal power bus of the memory, and the noise may be thus feed-back to the input buffer. Accordingly, the change detecting part should be included with the address buffer. Moreover, the address buffer and the change detecting part are included in FIG. 1 so that the short pulse outputted therefrom can drive the coupling part shown in FIG. 2. Through such an operation, if the common bus ATCOM falls to the low level, i.e., a ground voltage VSS, the delay circuit 21 turns on the first PMOS transistor MP1. Thereby, an output of a normal state is made.

However, in case that the pulse width of the signal ATD outputted from the change detecting part is narrow (see FIG. 4A), the NMOS transistors MN1~MNn turned on or turned off by the signal ATD don't have much operating time. Thus, the common bus ATCOM is not pulled down enough. Thereby, the potential of the common bus ATCOM can be maintained at a level between the positive voltage VCC and the ground voltage VSS (see FIG. 4B).

In this case, since the delay circuit 21 does not operate, the common bus ATCOM is pulled-up by the second PMOS transistor MP2. That is, as shown in FIG. 4C, since the output signal of the delay circuit 21 is not accurate, the potential of the common bus ATCOM is at the abnormal state. Thus, the output signal ATDSUM of the inverter INV which is used for reversely outputting the potential of the common bus ATCOM is generated as the short pulse or is shown in an abnormal form (see FIG. 4D).

The feature, as shown in FIG. 4, is needed in a reading operation of the memory. However, such feature can generate a malfunction in the memory in view of a fact that sequence of a signal should be appropriate for timing.

In case of using the coupling circuit according to the conventional art, it is difficult to prevent the clock signal ATDSUM from being generated as a short pulse.

SUMMARY OF THE INVENTION

Therefore, an object of the present invention is to provide a reference clock generating circuit for maintaining stability of a clock signal outputted as a reference signal, even though a coupling circuit doesn't have sufficient pull-down time because of short pulse noise during an address input or another noise on a power bus during an operation of the memory.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve the above object in accordance with the present invention, as embodied and broadly described, the reference clock generating circuit and method embodied therein comprises: a logical combination unit such as an OR unit for ORing signals indicative of a change sensed in an inputted address to apply an OR-result to a common terminal; a delay unit for delaying a signal on said common terminal; a pull-up unit for pulling-up an output potential of the OR unit according to an output signal of the delay unit; and a stabilizing unit for stabilizing the signal on the common terminal.

The reference clock generating circuit and method embodied therein of the present invention also comprises an OR unit for ORing signals indicative of a change sensed in an inputted address to apply an OR-result to a common terminal; a delay unit for inputting a voltage signal on the common terminal gate, for delaying the inputted signal for a predetermined time, and for NANDing the delayed signal and a chip enable signal; a pull-up unit for pulling-up a voltage on the output terminal of the common terminal to a predetermined voltage; and a stabilizing unit for inputting the chip enable signal and a signal delayed in the delay unit, for latching the voltage signal to be inputted to the delay unit, and applying the latched signal to the output terminal of the OR unit.

It is to be understood that both the foregoing general description and the following detailed description are exemplary and explanatory and are intended to provide further explanation of the invention as claimed.

BRIEF DESCRIPTION OF THE ATTACHED DRAWINGS

The accompanying drawings, which are included to provide a further understanding of the invention and are incorporated in and constitute a part of this specification, illustrate embodiments of the invention and together with the description serve to explain the principles of the invention:

FIGS. 7A–7E are waveforms illustrating main parts of the reference clock generating circuit of the present invention when an abnormal signal is inputted.

DETAILED DESCRIPTION OF PREFERRED EMBODIMENT

Reference will now be made in detail to the preferred embodiments of the present invention, examples of which are illustrated in the accompanying drawings.

Figure 1:
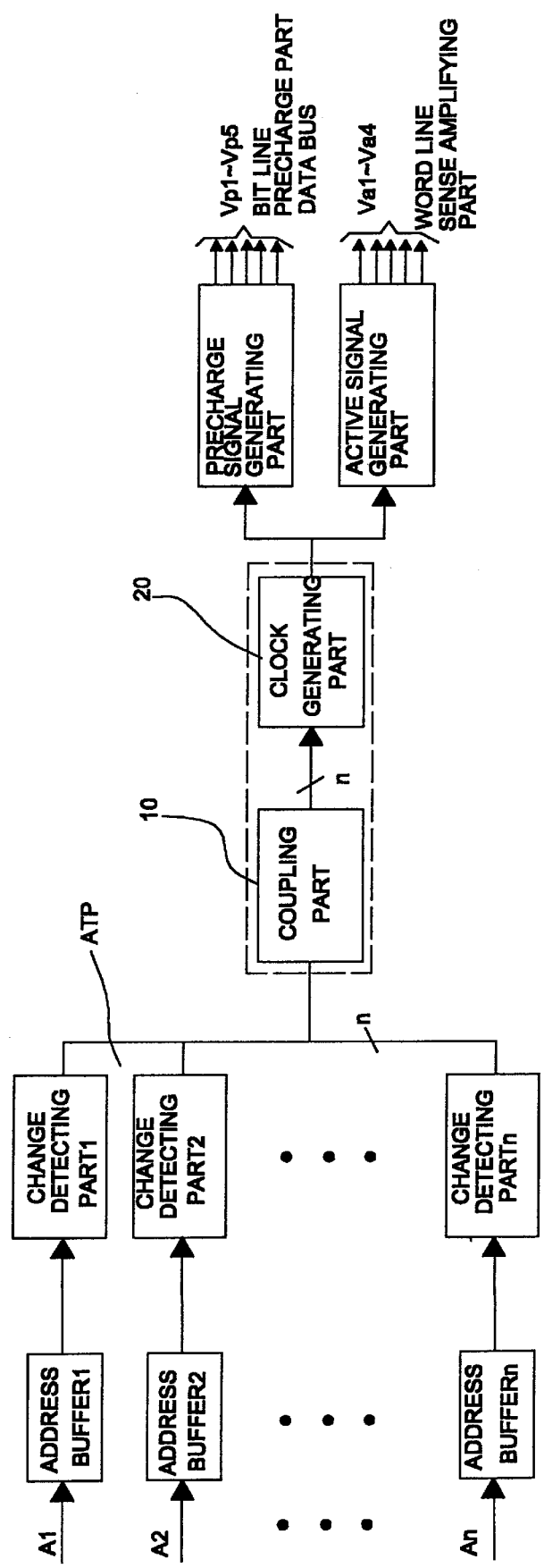
FIG. 1 is a construction diagram illustrating a conventional general circuit for generating a variety of control signals needed in accessing data of semiconductor memory elements.
Figure 2:
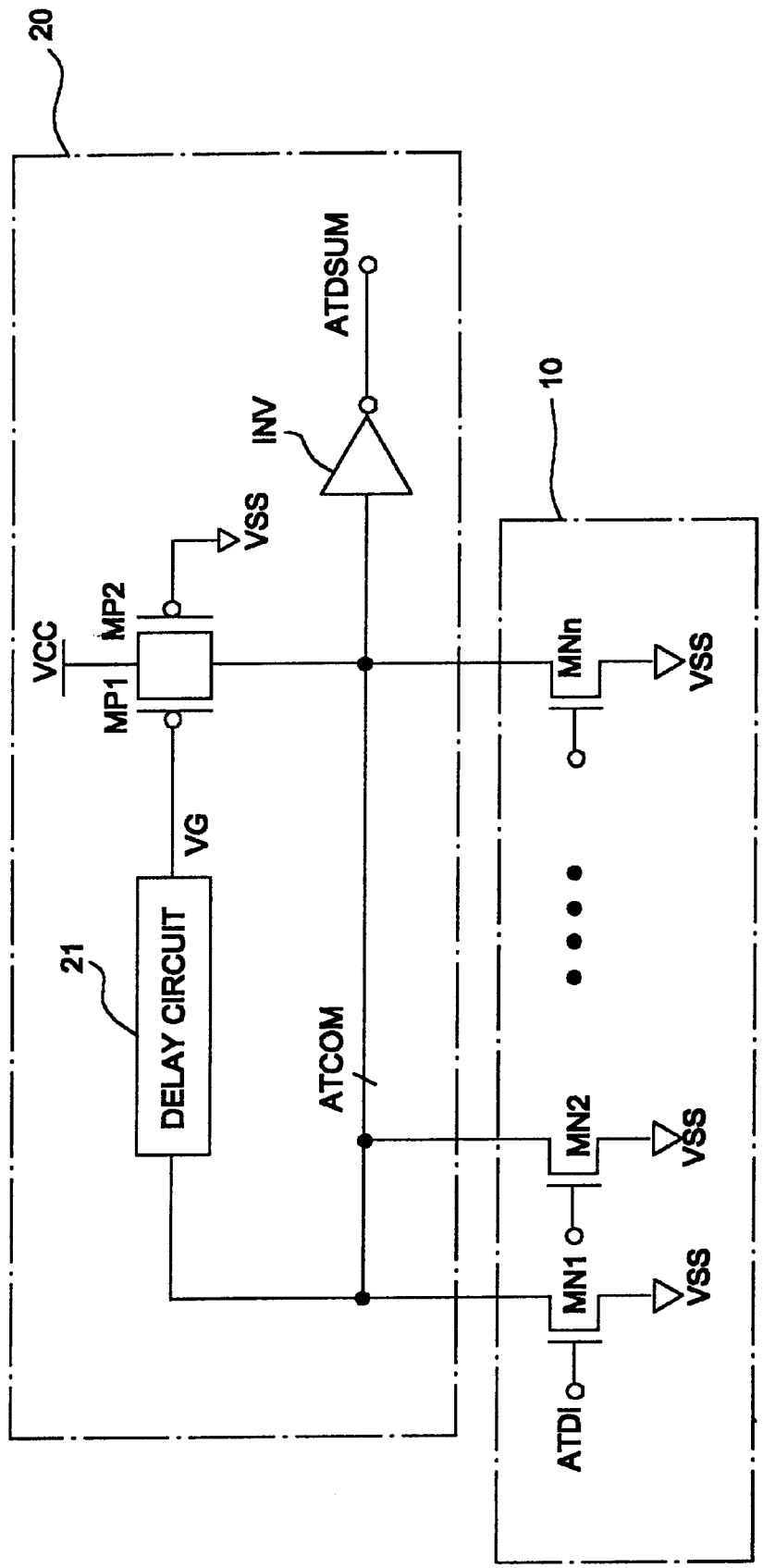
FIG. 2 is a construction diagram illustrating a conventional reference clock generating circuit.
Figures 3A, 3B, 3C, 3D:
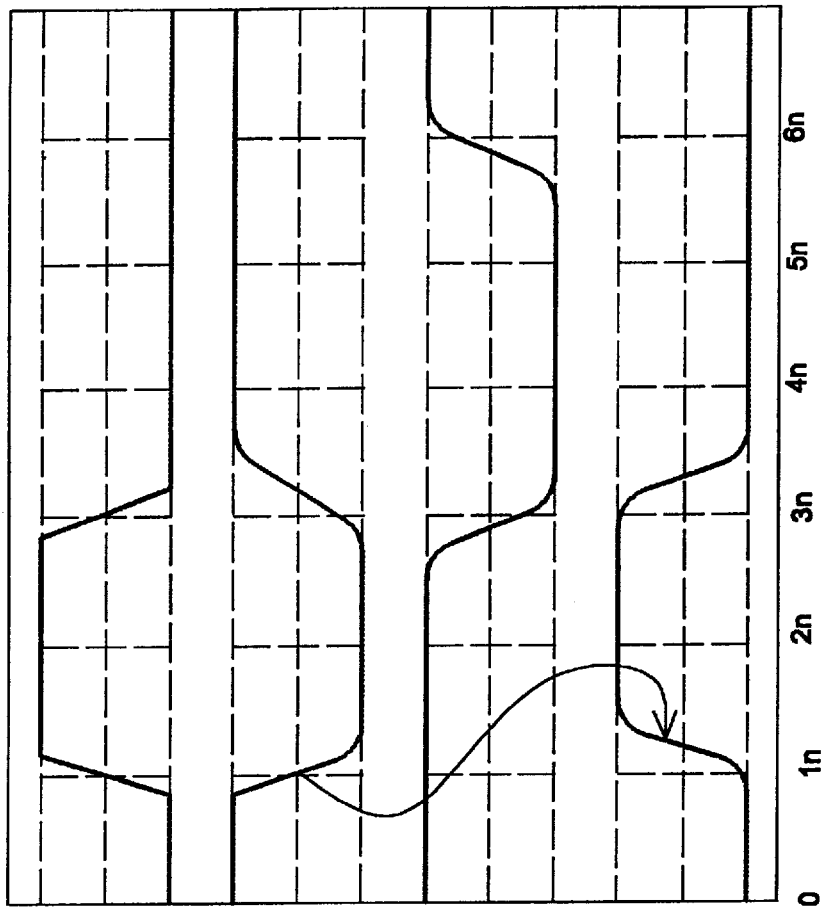
FIGS. 3A–3D are wave forms illustrating normal operation of the circuit of FIG. 2.
Figures 4A, 4B, 4C, 4D:
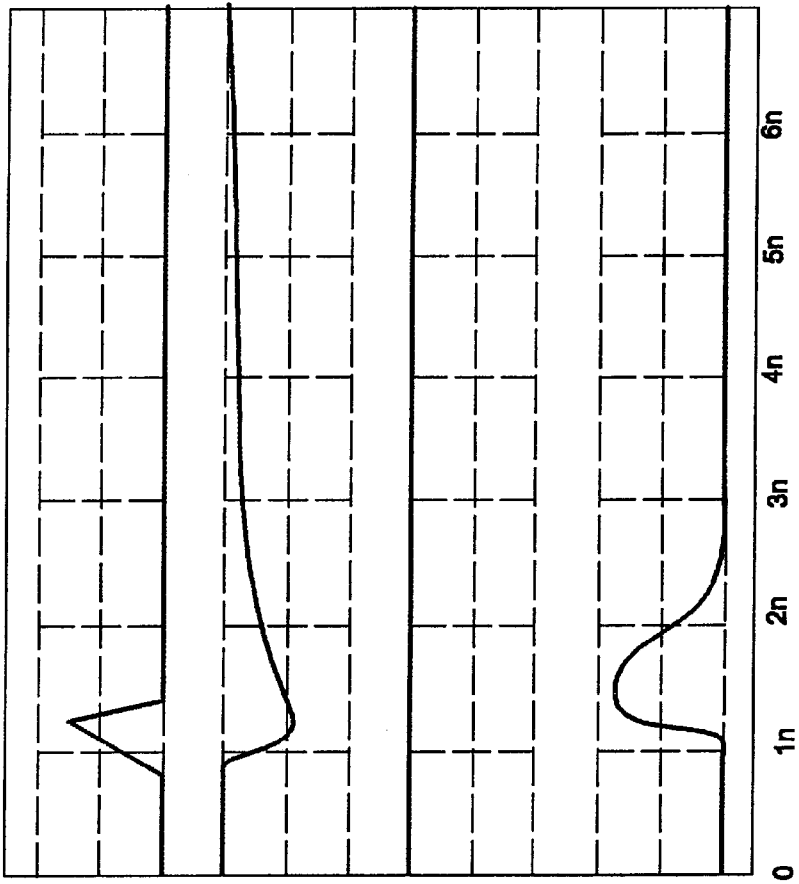
FIGS. 4A–4D are wave forms illustrating abnormal operation of the circuit of FIG. 2.
Figure 5:
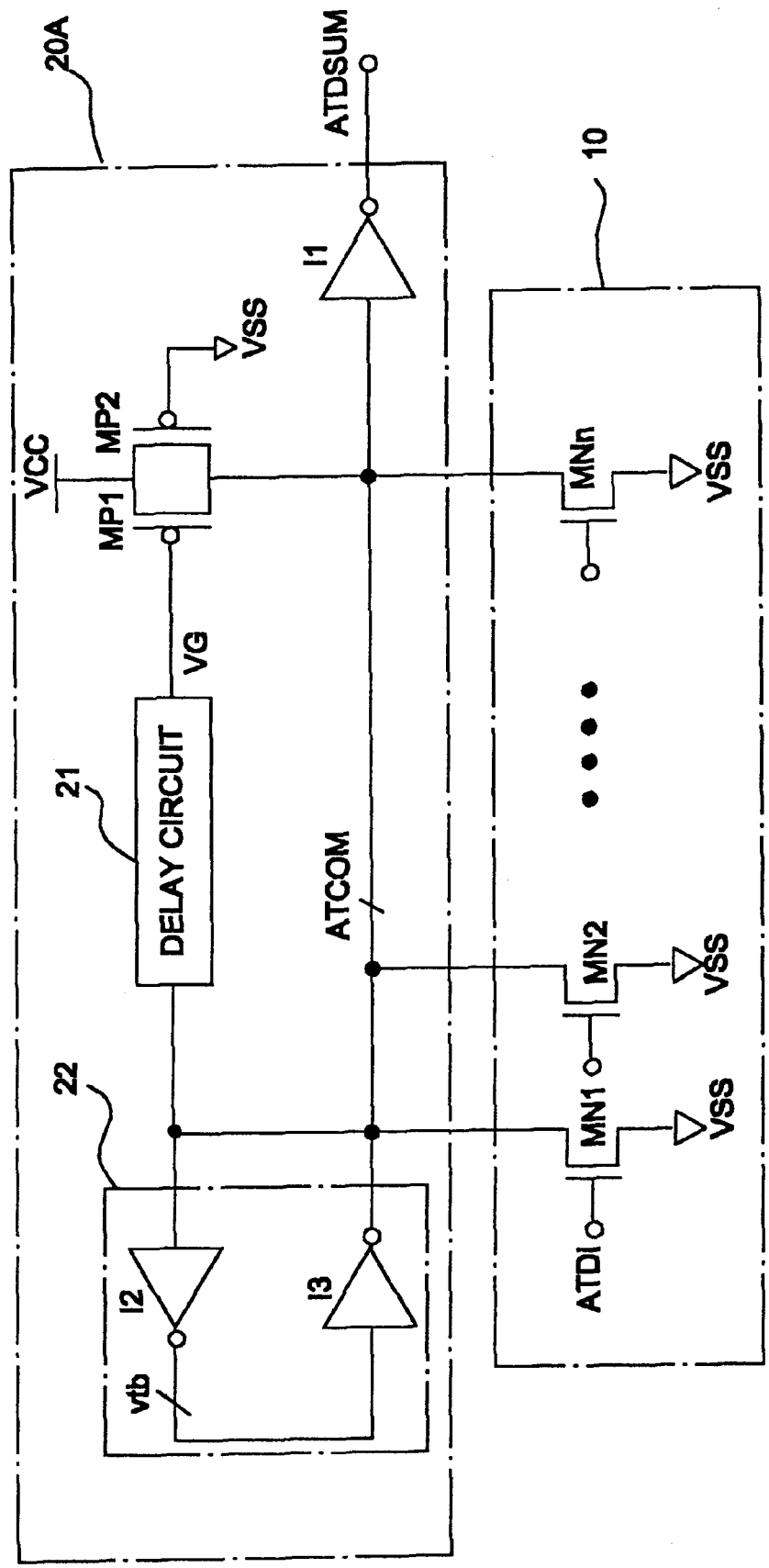
FIG. 5 is a construction diagram illustrating a reference clock generating circuit according to the present invention.

FIG. 5 is a construction diagram illustrating a reference clock generating circuit according to the present invention. Referring to FIG. 5, there are provided a plurality of NMOS transistors MN1~MNn, a delay circuit 21, a PMOS transistor MP, a feed-back latching part 22, and an inverter I1. The plurality of NMOS transistors MN1~MNn are turned on/off when detection signals ATDi are outputted from the corresponding plurality of change detecting parts of FIG. 1 according to change of address data. Further, when turned on, the plurality of NMOS transistors MN1~MNn maintain the potential of their drain terminals at the same level as that of their source terminals, i.e., they pull the line ATCOM down to VSS.

The delay circuit 21 has inputted to it the potential on a common bus ATCOM and delays the potential for a predetermined time prior to outputting it. The PMOS transistor MP whose gate terminal receives the signal VG of the delay circuit 21, is turned on when the output signal VG is at the low level, and transmits a predetermined positive voltage VCC to the common bus ATCOM connected with its drain terminal, the positive voltage VCC being inputted to its source terminal. The PMOS transistor MP pulls-up the common bus ATCOM.

The feed-back latching part 22 has inputted to it the potential on the common bus ATCOM. Its purpose is to stabilize a signal to be inputted to the delay circuit 21. The latching circuit 22 includes the inverter I2 receiving the signal on the line ATCOM, and the inverter I3 receiving the inverted signal ATCOM from the inverter I2. The output of the inverter I3 is connected back to the line ATCOM. The inverter I1 has inputted to it the potential on the common bus ATCOM and inverts that potential to drive a load (not shown) connected to its output terminal ATDSUM.

Again, the feed-back latching part 22 has a second inverter I2 and a third inverter I3. The second inverter I2 inverts the potential of the common bus ATCOM to be inputted to the delay circuit 21. The third inverter I3 inverts the signal from the second inverter I2 and provides the now-twice inverted signal to the common bus ATCOM.

In comparison, the above construction has the same coupling part 10 (having the NMOS transistors MN1~MNn) as the conventional art. On the other hand, in the clock generating part 20, the constructions of the delay circuit 21, the PMOS transistor MP, and the inverter I1 are different from the conventional art.

The differences between the conventional art and the present invention include the second PMOS transistor MP2 not being used in the present invention, and the use by the present invention of the feed-back latching part 22 (having the second and third inserters I2 and I3 connected to the common bus ATCOM).

The second inverter I2 has a higher current driving capability than the first inverter I1. The third inverter I3 has a larger equivalent resistance value than either the first or the second PMOS transistors MP1 and MP2 respectively. This configuration enables the common bus ATCOM to have a minimum changing time when the common bus is pulled down when one or more of the NMOS transistors MN1~MNn is turned on, or during the pull-up thereof when the PMOS transistor MP is turned on.

With reference to FIGS. 7A–7E, the third inverter I3 has a very large equivalent resistance value, as compared with any of the NMOS transistors MNi and the PMOS transistor MP.

In the case that a normal signal ATDi from one of the change detecting parts is received by the coupling part 10, the output feature is almost the same as that of the circuit according to the conventional art. In the case that a signal ATDi of the change detecting part has an abnormal, i.e., small, width because of noise, the voltage on the common bus ATCOM, as mentioned above, may fall to a level between VCC and VSS.

At this time, since the logic limitation of the second inverter I2 is at the high value, the potential Vtb of the output signal of the second inverter I2 reaches the high level quickly. Therefore, the common bus ATCOM is pulled-down by the third inverter I3 and finally falls to the VSS level. After a predetermined time has passed, the common bus is again pulled-up to the VCC level by the PMOS transistor MP.

Accordingly, the common bus is outputted in a constant width form.

However, the circuit according to the present invention has a problem in that pull-down speed of the common bus is slow during feed-back through the latching part. This may function as an unstable element in the response of the delay circuit 21 or the first inverter I1. Accordingly, this embodiment is not optimal for a high speed memory in which the access time is below 30 ns.

Figure 6:
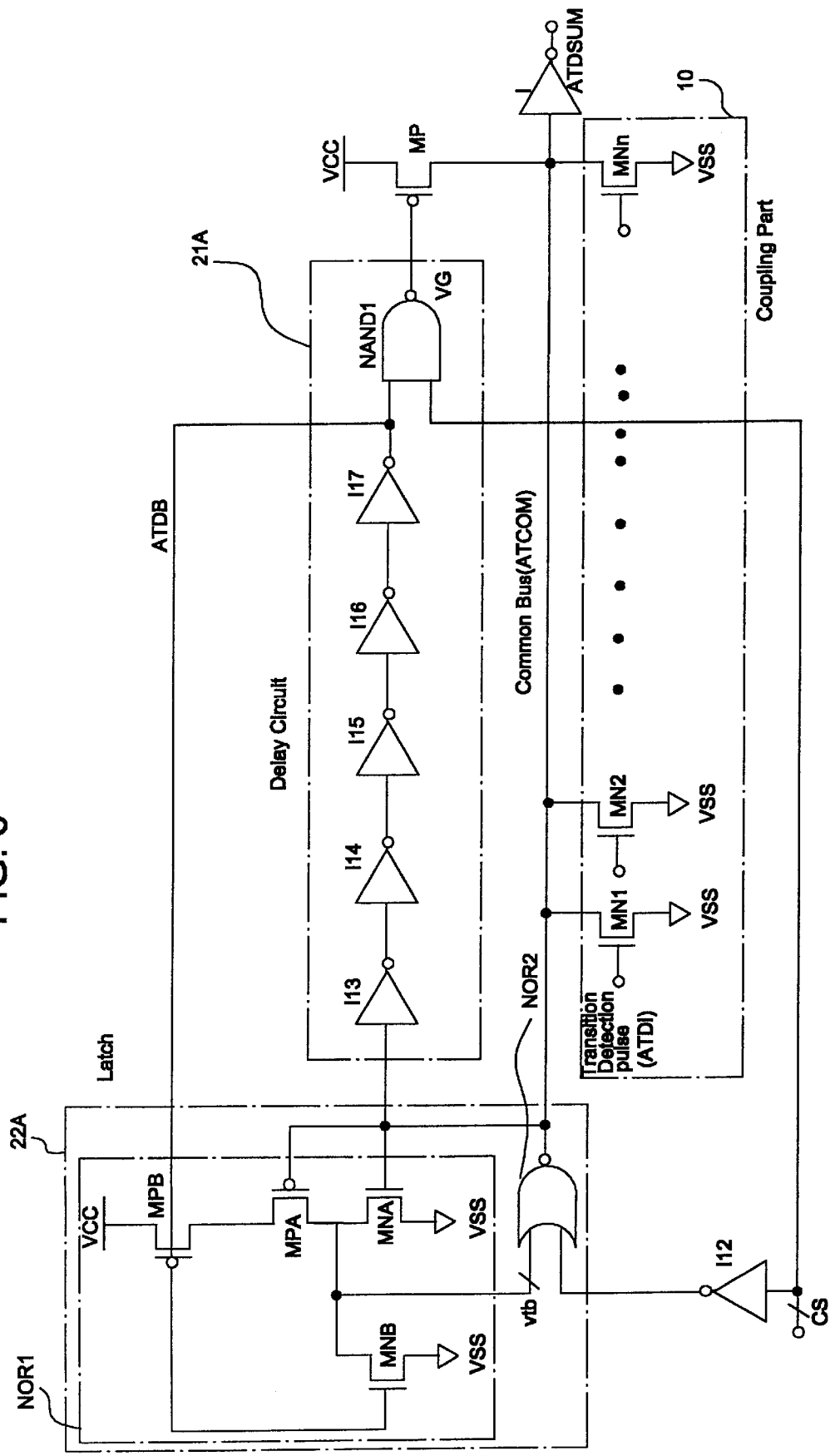
FIG. 6 is another construction diagram illustrating a reference clock generating circuit according to the present invention.

To solve the above problem, another embodiment of the reference clock generating circuit according to the present invention is shown in FIG. 6. The circuit shown in FIG. 6 is optimal for a high speed memory in which the access time is below 30 ns. Particularly, the improved circuit is controlled by a chip enable signal CS normally applied to an SRAM.

Hereinafter, a comparison will be made between FIG. 5 and FIG. 6.

First of all, the delay circuit 21A has multistep inverter gates I13~I17 and a NAND gate NAND1. The multistep inverter gates I13~I17 have inputted thereto the potential of the common bus ATCOM and invert that potential, respectively. The NAND gate NAND1 receives the signal from the last inverter I17 and the chip enable signal CS, and NANDs the two signals together. The output signal of the NAND gate NAND1 is supplied as a gate input signal for controlling the on/off operation of the PMOS transistor (which is used to pull-up the common bus ATCOM).

Further, the latching part 22A has a first NOR gate NOR1 and a second NOR gate NOR2. The first NOR gate NOR1 has inputted thereto the ATDB signals inputted to the NAND gate NAND1 and the potential of the common bus ATCOM, and then NORing the signals. The second NOR gate NOR2 has inputted to it a signal from a node in the first NOR gate and the inverse of the chip enable signal CS, and then NORs the signals.

The NOR gate NOR1 has a PMOS transistor MPB, a PMOS transistor MPA, an NMOS transistor MNA, and an NMOS transistor MNB. The PMOS transistor MPB to whose gate terminal is inputted the ATDB signal, is selectively turned on/off thereby. The PMOS transistor MPA, whose source terminal is connected to a drain terminal of the PMOS transistor MPB, has inputted to its gate the ATCOM signal and is turned on/off thereby. The NMOS transistor MNA, whose drain terminal is connected to that of the PMOS transistor MPA, has inputted to its gate the same signal inputted to the gate terminal of the PMOS transistor MPA, namely ATCOM. The NMOS transistor MNA is turned on/off oppositely to the PMOS transistor MPA. The NMOS transistor MNB, whose drain terminal is connected to that of the PMOS transistor MPA, has inputted to its gate the same signal inputted to the gate terminal of the PMOS transistor MPB, namely ATDB. The NMOS transistor MNB is turned on/off oppositely to the PMOS transistor MPB.

In contrast to the embodiment mentioned in the explanation of FIG. 5, the feed-back latching part 22A of FIG. 6 has two NOR gates. To one side of the NOR gates is inputted the potential of the common bus, and such input is designed to have high current driving capability. Further, the other side of the NOR gates receives the inverted signal of the common bus in the form of the signal ATDB, and such input is designed to have a logic limitation to about VCC/2. The second NOR gate NOR2, which is used as an output part, is not shown in detail. However, in the second NOR gate, the current driving capability of the PMOS transistor is intended to be small, but that of the NMOS transistor is intended to be large.

In the operation of the embodiment of FIG. 6, the potential of the output signal Vtb of the first NOR gate NOR1 in the latching part 22A is at the low level during the static state. The PMOS transistor of the second NOR gate NOR2 maintains the common bus ATCOM at the high level.

Further, the chip enable signal CS is maintained at the high level during the normal operation.

In the embodiment of FIG. 6, if the voltage on the common bus ATCOM falls to a level between the VCC and the VSS by way of a short pulse, the output signal Vtb of the first NOR gate NOR1 is changed to the high level from the low level by resistance ratio of the first NOR gate NOR1.

At this time, since the output signal ATDB from the last output inverter I17 of the inverters I13~I17 is at the low level, the NMOS transistor MNB is turned off and the PMOS transistor MPB is turned on.

The PMOS transistor MPA is subjected to be larger than the NMOS transistor MNA. Therefore, even though the potential of the common bus ATCOM is around VCC/2, the output signal Vtb of the first NOR gate NOR1 is rapidly changed to the high level.

Accordingly, the larger NMOS transistor of the second NOR gate NOR2 pulls-down the common bus ATCOM.

After a predetermined time has passed, if the output signal ATDB from the last output inverter I17 is changed to the high level, the PMOS transistor MPB of the first NOR gate NOR1 is turned off, and the NMOS transistor MNB is turned on, so that the output signal Vtb of the first NOR gate NOR1 is changed to the low level.

Therefore, even though the transistors of the second NOR NOR2 gate are not shown, the NMOS transistor of the second NOR gate NOR2 is turned off and the PMOS transistor is turned on.

Accordingly, since the output of the NAND gate NAND1 is at the low level and the PMOS transistor MP is turned on, the common bus ATCOM is again changed to the high level.

As mentioned above, the common bus ATCOM is outputted in the same manner as a normal input.

In conclusion, in the case that the circuit according to the present invention, as shown in FIGS. 5 and 6, is used, it is possible to generate the accurate reference clock, regardless of a change in the input state, and is also possible to eliminate the short pulse without an additional delay element.

It will be apparent to those skilled in the art that various modifications and variations can be made in the reference clock generating circuit of the present invention without departing from the spirit or scope of the invention. Thus, it is intended that the present invention cover the modifications and variations of this invention provided they come within the scope of the appended claims and their equivalents.

What is claimed is:

1. A reference clock generating circuit in an asynchronously precharged or activated memory, for responding to signals indicative of a change in an address input and for generating reference clocks of various precharge signals or active signals, comprising:
    a logical combination unit for logically combining said signals indicative of a sensed address change to apply a combined signal to a common terminal;
    a delay unit for delaying a signal on said common terminal and for controlling a logical state of the delayed signal as a function of a chip enable signal;
    a pull-up unit for pulling-up an output potential of said logical combination unit according to an output signal from said delay unit; and
    a stabilizing unit for stabilizing said signal on said common terminal.

2. The circuit as claimed in claim 1, further comprising a buffering unit for buffering said signal on said common terminal.

3. The circuit as claimed in claim 1, wherein said stabilizing unit comprises a latch unit for latching said signal on said common terminal and for feeding back the latched signal to an output terminal of said logical combination unit.

4. The circuit as claimed in claim 3, wherein said latch unit includes a first inverter to buffer and invert said signal on said common terminal.

5. The circuit as claimed in claim 4, wherein said latch unit comprises:
    a second inverter for inverting an output signal of said first inverter to provide a second inversion signal, and for providing said second inversion signal to said output terminal of said logical combination unit.

6. The circuit as claimed in claim 5, further comprising a buffering unit for buffering said signal on said common terminal and wherein said first inverter has a higher current driving capability than said buffering unit.

7. The circuit as claimed in claim 1, wherein said logical combination unit includes an OR unit for ORing said signals indicative of a sensed address change.

8. The circuit as claimed in claim 7, wherein said OR unit includes wired OR circuitry.

9. The circuit as claimed in claim 8, wherein said wired OR circuit includes a switching unit responsive to an external chip select signal, an output of said switching unit being connected to said common bus.

10. The circuit as claimed in claim 1, wherein said delay unit includes multistep inverter gates connected in series to each other.

11. The circuit as claimed in claim 1, wherein said pull-up unit includes a PMOS transistor for pulling-up said output potential of said OR unit according to said output signal of said delay unit.

12. A reference clock generating circuit in an asynchronously precharged or activated SRAM, said SRAM receiving a chip enable signal, said reference clock generating circuit being for responding to signals indicative of a change in input address data and for generating reference clocks of precharge signals or active signals, said reference clock generating circuit comprising:
    an OR unit for ORing said signals indicative of a sensed address change;
    a delay unit for inputting a voltage signal on an output terminal of said OR unit, for delaying said input signal for a predetermined time, and for NANDing said delayed signal and said chip enable signal;
    a pull-up unit for pulling-up a voltage on said output terminal of said OR unit to a predetermined voltage according to an output signal from said delay unit; and
    a stabilizing unit for inputting said chip enable signal and a signal delayed in said delay unit, for latching said voltage signal inputted to said delay unit, and applying said latched signal to said output terminal of said OR unit.

13. The circuit as claimed in claim 12, wherein said delay unit includes multistep inverter gates connected in series to each other, and a NAND gate for inputting an output signal from the last inverter of said multistep inverter gates and said chip enable signal and for NANDing said signals.

14. The circuit as claimed in claim 12, wherein said stabilizing unit comprises:
    a first NOR unit for inputting said signal delayed in said delay unit and a potential of a common bus, and NORing said signals; and
    a second NOR unit for inputting an output signal of said first NOR unit and an inversion of said chip enable signal, and for NORing said signals.

15. The circuit as claimed in claim 14, wherein said first NOR unit comprises:
    a CMOS inverter having a gate terminal of a first PMOS transistor connected with a gate terminal of a first NMOS transistor, and drain terminals thereof connected together;
    a second PMOS transistor the source terminal of which having inputted thereto a driving voltage of a predetermined size and a drain terminal of which is connected to a source terminal of said first PMOS transistor in said CMOS inverter; and
    a second NMOS transistor the gate terminal of which is connected to the gate terminal of said second PMOS transistor, the drain terminal of said second NMOS transistor being connected to a drain terminal of a transistor of said CMOS inverter, signals inputted to gate terminals of said CMOS inverter and said second PMOS transistor representing an input signal for a NOR operation, and said drain terminal of said transistor of said CMOS inverter representing an output terminal.

16. The circuit as claimed in claim 12, further comprising a buffering unit for buffering said voltage signal on said output terminal of said OR unit.

17. In an asynchronously precharged or activated memory, a method for generating reference clock pulses that is responsive to signals indicative of an address change, the method comprising the steps of:

logically combining said signals indicative of a sensed address change and providing an OR-result signal to a common terminal;

delaying a signal on said common terminal to produce a delayed signal;

controlling a logical state of said delayed signal as a function of a chip enable signal;

pulling up a signal on said common terminal according said delayed signal; and stabilizing said signal on said common terminal.

18. The method of claim 17, wherein said step of logically combining includes ORing said signals indicative of a sensed address change.

19. The method of claim 17, wherein said step of stabilizing includes feeding back said signal on said common terminal to said common terminal.

20. The method of claim 19, wherein said step of feeding back includes inverting said signal on said common terminal to produce a once-inverted signal, inverting said once-inverted signal to produce a twice-inverted signal, and providing said twice-inverted signal to said common terminal.

* * * * *